United States Patent [19]

Ceraso

[11] Patent Number: 5,615,470
[45] Date of Patent: Apr. 1, 1997

[54] PROCESS FOR PRODUCING PLASTIC LAMINATES WITH METAL LAMINAE

[75] Inventor: Bruno Ceraso, Milan, Italy

[73] Assignee: Cedal S.r.l., Milan, Italy

[21] Appl. No.: 331,661

[22] PCT Filed: Aug. 7, 1992

[86] PCT No.: PCT/IT92/00101

§ 371 Date: Nov. 7, 1994

§ 102(e) Date: Nov. 7, 1994

[87] PCT Pub. No.: WO93/22139

PCT Pub. Date: Nov. 11, 1993

[30]  Foreign Application Priority Data

May 5, 1992 [IT] Italy ................................. MI92A1060
Jul. 9, 1992 [IT] Italy ................................. MIV003006

[51] Int. Cl.$^6$ ................................................ B21D 35/00
[52] U.S. Cl. ..................... 29/469.5; 156/273.9; 156/216; 156/267; 156/288
[58] Field of Search ...................... 29/469.5; 156/272.2, 156/273.9, 216, 227, 267, 288

[56]  References Cited

U.S. PATENT DOCUMENTS 1,945,560  2/1934  Meyercord ............................... 156/288
3,592,993  7/1971  Bennett ..................................... 219/83
3,969,177  7/1976  Doran et al. ............................. 156/288

FOREIGN PATENT DOCUMENTS 1169122  12/1958  France ................................... 156/288
913081  6/1954  Germany ............................... 156/288
1321305  6/1973  United Kingdom ................. 156/272.2

OTHER PUBLICATIONS

Japanese Patent Abstract 60–166428(A), Aug. 1985, Matsuhita Denko K.K., "Laminate Molding Method Of Metal Lined Laminated Board".

*Primary Examiner*—David P. Bryant
*Attorney, Agent, or Firm*—Michael J. Striker

[57] ABSTRACT

The process for making plastic laminates, each of which consists of a package having an upper face and a lower face and consisting of a stack of prepreg sheets with a metal lamina on each face, includes the steps of providing a stack of prepreg sheets with a metal band passing in a serpentine manner back and forth through the stack; connecting end portions of the metal band to a source of electric current of sufficient power and passing the electric current through the metal band to heat the metal band and the prepreg sheets, applying pressure to the prepreg sheets with the metal band passing therethrough in a serpentine manner and, after application of sufficient heat and pressure, cutting through bends formed in the metal band to form a plurality of plastic laminates, each consisting of a stack of prepreg sheets sandwiched between metal laminae formed from the metal band.

10 Claims, 5 Drawing Sheets

PROCESS FOR PRODUCING PLASTIC LAMINATES WITH METAL LAMINAE

BACKGROUND OF THE INVENTION

The invention concerns the processes for production of plastic laminates with metal laminae.

Generally plastic laminates consist of sheets formed of several layers of plastic materials, assembled together in a stable manner, usually by pressing, on a base of paper, fabric, fiber glass or other materials. The plastic materials may be of phenol, melamine, epoxy, polyester, silicon, fluoride or others.

In the production of printed circuits a metal lamina, usually of copper, is made to adhere to one or both sides of a plastic laminate during the pressing process.

A pile of packages, all virtually the same, is formed; each of these comprising a number of sheets, impregnated with plastic materials, and copper laminae one of which is placed on each side of each package.

A sheet of metal, stainless steel or some other kind, is placed between each package, and the pile so formed is put inside a multiple-plate press that provides heat and pressure simultaneously.

When each heat cycle, in which a temperature of 190° C. may be reached at pressures of up to 100 kg/cm$^2$, lasting over 100 minutes and including a cooling stage down to 70°–80° C., has been terminated, a compact and rigid product is obtained whose single components are closely associated.

Presses suited to this kind of production must necessarily be complex and have a low output because of their many heating plates and they produce heat and pressure at the same time in well-defined and accurate sequences, according to their needs to create, by conduction, uniform temperatures throughout the various packages in the pile of which obviously only those at the top and bottom will be in contact with the heating plates.

Particularly, the conduction of heat from the press's heating plates to the plied up packages, and vice versa during the cooling -stage, is greatly hindered because of intervening components made of fiber glass impregnated with plastic materials, or others equally insulating, which are known to be very poor conductors of heat, in the packages above and below such material in the pile.

In addition to complicating the structure of the press, the presence of many heating plates slows down loading and unloading of packages, while problems are created for short runs of production, these being relatively more costly.

SUMMARY OF THE INVENTION

It is an object of the present invention provide a process for production of plastic laminates with metal laminae, especially for printed circuits, which is improved and minimizes, reduces or eliminates one or more of the above-described disadvantages.

According to the invention the process for production of plastic laminates with metal laminae, especially for printed circuits, comprises formation of piles of packages, each package consisting of a stack of prepreg sheets, i.e. a number of support sheets, impregnated with plastic material, and metal laminae on one or both faces.

The metal laminae are made from or rolled off a continuous band. An initial portion of band is made to match and contact the lower face of the first group of prepreg sheets, starting from below. After making a bend of 180°, a second portion of the metal band is laid on the upper face of the first group and after placing there a rigid metal flattering sheet and making a second bend of 180°, in the opposite direction to that of the first, a third portion is placed on the lower face of the second group of sheets.

After making a third bend of 180° in the direction opposite to that of the second bend, the band is placed onto the upper face of this next group of sheets, and so on until the upper face of the last group sheets is reached.

The two ends of the band are connected to a suitably powered generator of electricity.

An adequate pressure is applied to the pile of packages and the generator is turned on so that the various lengths of band matching with the faces of the packages, which act as electric resistances are heated so that close association is made among the various component parts of the package and plastic laminates are duly formed.

The metal band is preferably a copper band.

The required pressure on the pile of packages can be obtained by putting the pile inside a cold press or else in an autoclave.

In accordance with a preferred method each pile of packages is placed inside a die which has an upper and a lower plate connected by guiding and supporting pins. In this way the pressure needed can be applied in the die. Pressure on the die can be provided by putting it inside a cold press or in an autoclave.

The invention offers many advantages.

As the presses do not have to provide heat and pressure simultaneously, they can be simpler, and various kinds of presses can be used to generate adequate pressure. Heat is generated at each single package and an even temperature can be reached within a short time. Production runs can be either long or short. As the various copper laminae in each package can be o furnished in the form of a continuous band, cooling times are also considerably reduced.

Both heating and cooling are therefore more quickly done since heating or cooling is not impeded in each package by components of fiber glass or other supporting material impregnated with plastic materials which are well known to be very poor heat conductors, in the packages above and below as happens with prior art processes.

In the event of combined forms of heating being used—the conventional kind by heating plates at each end of the pile of packages and the direct kind according to the invention through the copper bands—heating times are still further reduced and productivity increased.

Work cycles are speeded up and simplified so that costs are lowered when the process according to the invention is used.

BRIEF DESCRIPTION OF THE DRAWING

Characteristics and purposes of the invention will be made still clearer by the following example illustrated by diagrammatically drawn figures, in which.

DESCRIPTION OF THE PREFERRED EMBODIMENT

Figure 1:
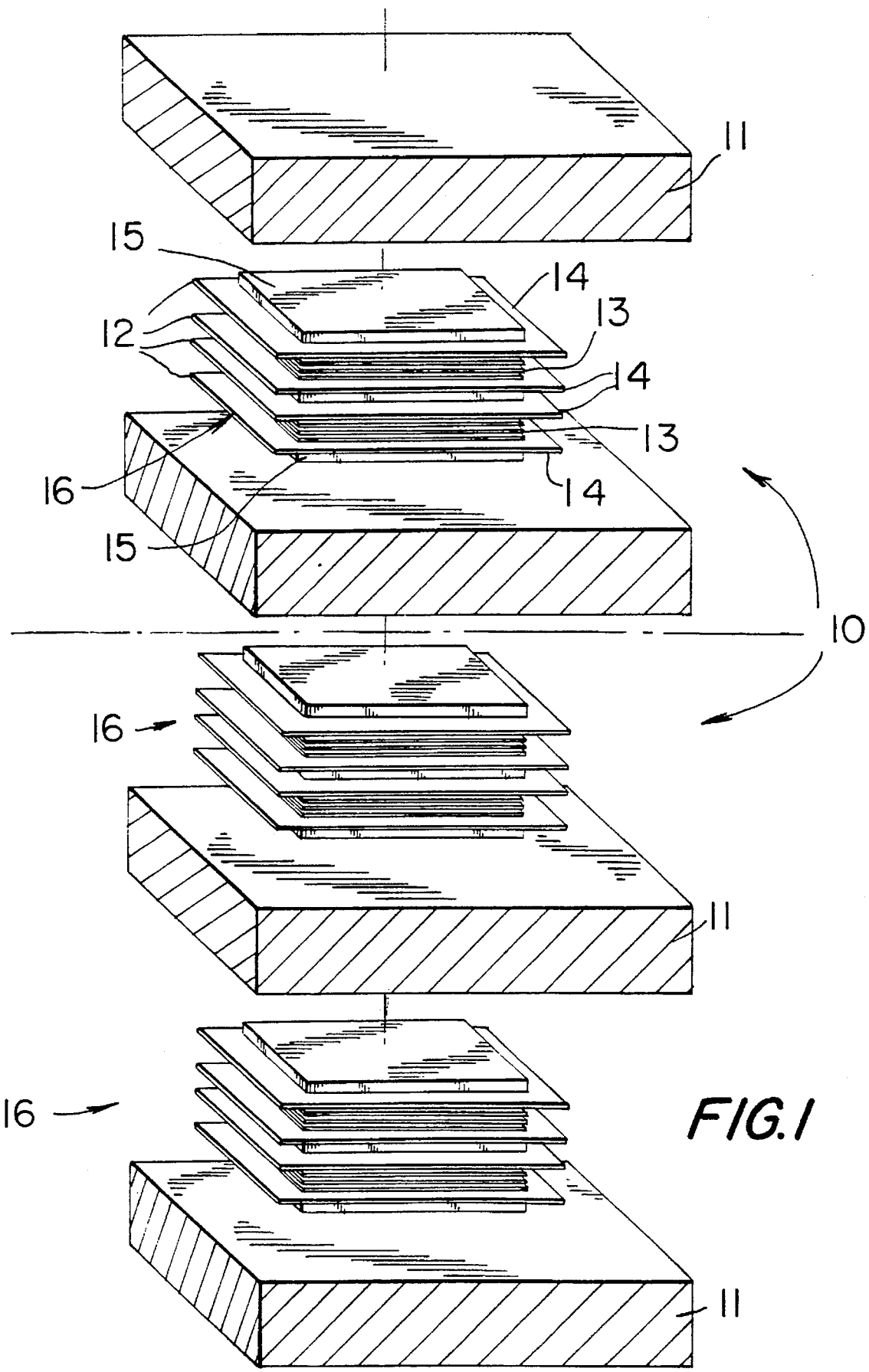
FIG. 1 is a perspective view of a prior art multiplate press for simultaneous production of heat and pressure containing packages wherewith to make laminates for printed circuits by means of prior art methods.

In FIG. 1 the prior art multiplate press 10 has heating plates 11 between which the piles 16 of packages 12 are placed.

The packages 12 are composed of prepreg sheets 13 of fiber glass fabric impregnated with epoxy resins and the copper laminae 14.

Separate steel sheets 15 are placed between one package and another. In the pile 20 according to the invention in FIG. 2 the packages 21 are composed of stacks 22–24 of fiber glass prepreg sheets 25 impregnated with epoxy resin.

Figure 2:
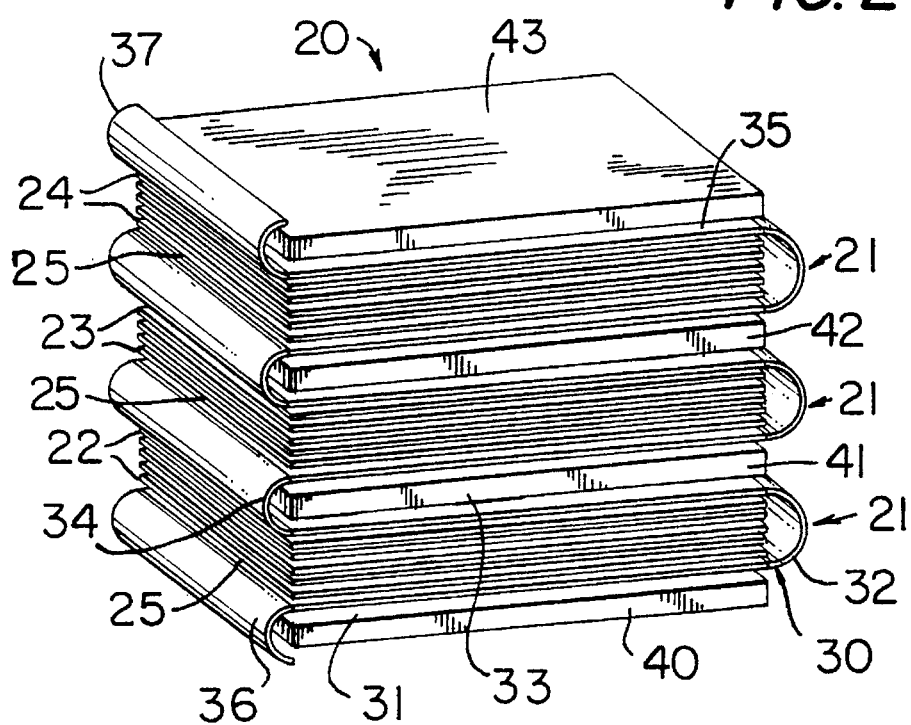
FIG. 2 is a perspective view of a pile of packages formed using the process of the present invention.

The continuous copper band 30 winds through the pile in a serpentine manner between one group and another in the pile 20 according to the invention shown in FIG. 2.

Steel flattering sheets 40–43 are inserted between packages.

As illustrated, the first portion 31 of band 30 is laid above the first steel flattering sheet 40.

When the stack 22 of sheets 25 of fiber glass fabric has been deposited, the band makes a 180° bend 32 in order to deposit the portion 33 on the upper face of the last sheet of stack 22.

Having placed the second steel flattering sheet 41 on the band, the band makes another bend 34 in the direction opposite to the first one so as to contact with the upper face of the steel flattering sheet 41, and so on until the top portion 35 is put in position and the steel sheet 43 put over it.

The initial and final ends 36 and 37 are allowed to project outwards.

Figure 3:
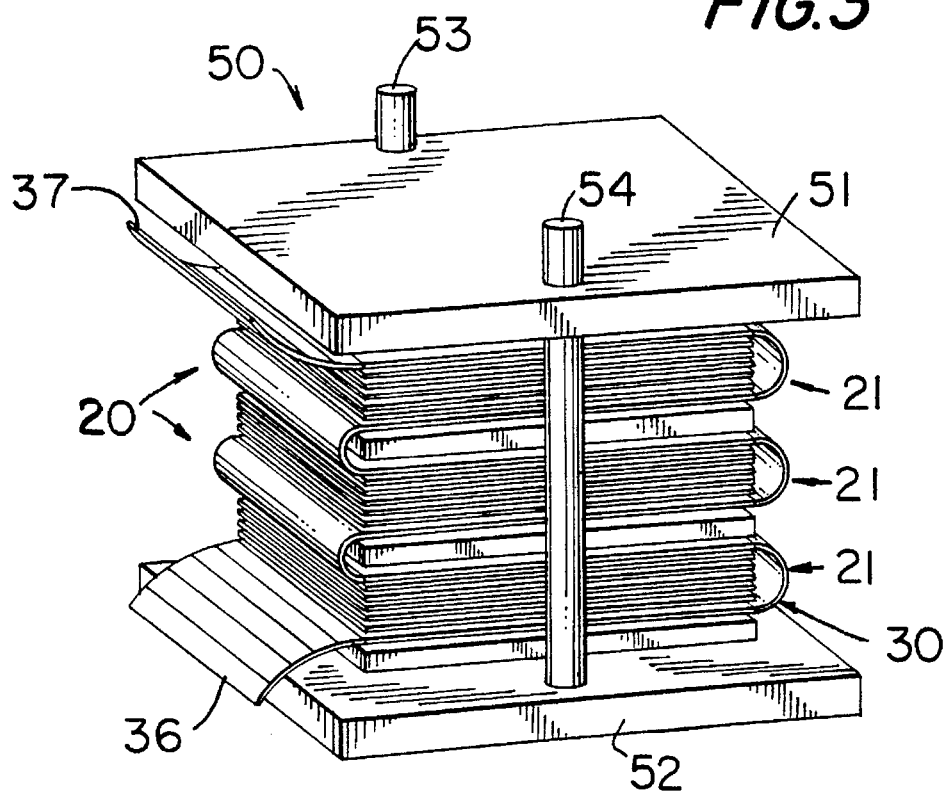
FIG. 3 is a perspective view of a pile of packages, as in FIG. 2, put in a die.

The pile 20 so formed is put into a die 50 between the plates 51 and 52 connected by the two pins 53 and 54 as seen in FIG. 3 and the ends 35 and 36 are shown projecting further out.

Figure 4:
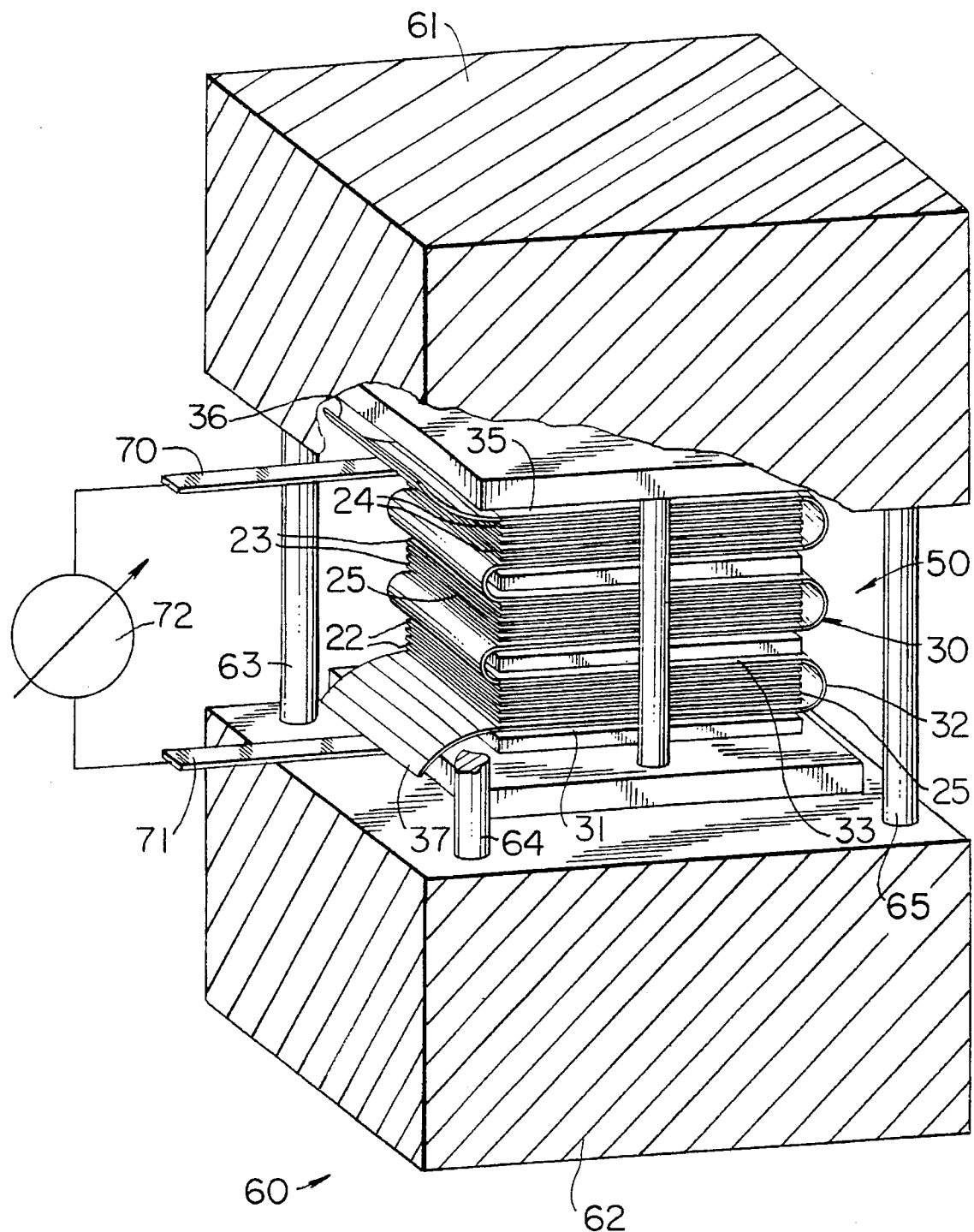
FIG. 4 is a cutaway perspective view of the die in FIG. 3 placed inside a cold press.

In FIG. 4 a cold hydraulic press 60 with top and bottom plates 61 and 62 connected and guided by four columns 63–65 at the four corners is shown.

This press is useful only to compress piled up packages. The above die 50 is placed between plates 61 and 62. The ends 36 and 37 of the band 30 are connected electrically to conductors 70 and 71 connected to a generator 72 of electricity. On closing the electric circuit the whole band acts like an electric resistance and all its portions, such as 31, 33, 35, give off direct heat to stacks 22–24 of prepreg sheets 25 and this, added to simultaneous pressure from the press, gives rise to the pressing process.

Cuts are then made at bends 32, 34 and the others between the various portions of band 31, 33, 35 providing laminates for printed circuits simply and quickly.

Figure 5:
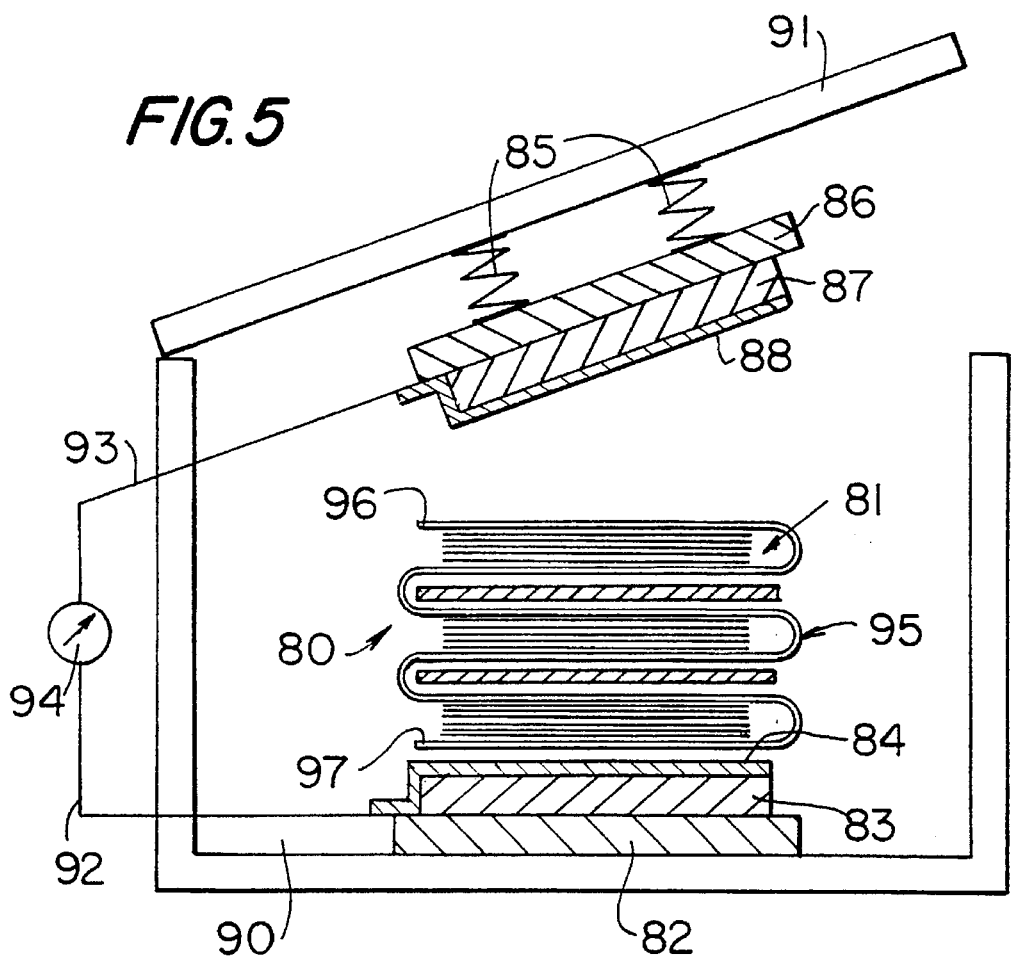
FIG. 5 is a cross-sectional view through a pile of packages placed inside an open autoclave.

FIG. 5 shows a pile 80 of packages similar to the pile 20 already seen in FIGS. 2–4, put inside an autoclave 90. On the bottom 82 of the autoclave there is a plate 83 covered with a conducting lamina 84.

To the cover 91 of the autoclave a second plate 86 is fixed by means of elastic devices 85, and to it is fixed a plate 87 covered with a conducting lamina 88.

The laminae 84 and 88 are connected electrically to a generator 94 of electricity of suitable power by means of elastic conductors, a lower one 92 and an upper one 93.

Figure 6:
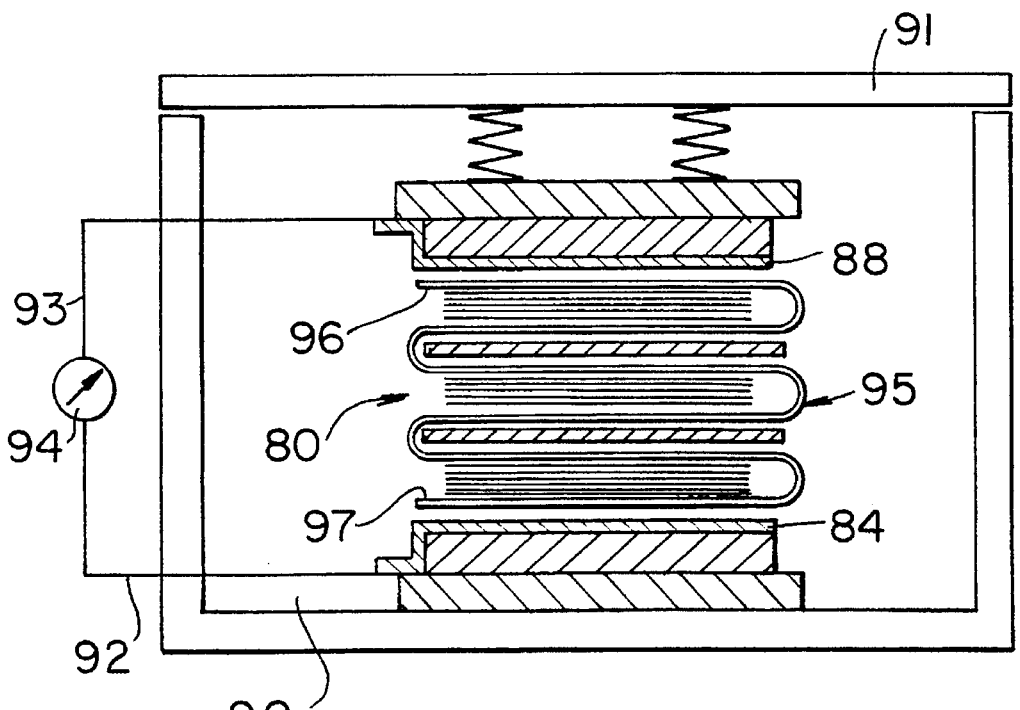
FIG. 6 is a cross-sectional view through the autoclave and pile of packages shown in FIG. 5 but with the autoclave closed.

As will be seen in FIG. 6, when the lid is closed, the lamina 88 coincides with the end 96 of the metal band 95.

Since the other end 97 of the band contacts with the lamina 84, closing the lid closes the circuit between the generator and the band, and therefore begins the pressing process as previously described.

Figure 7:
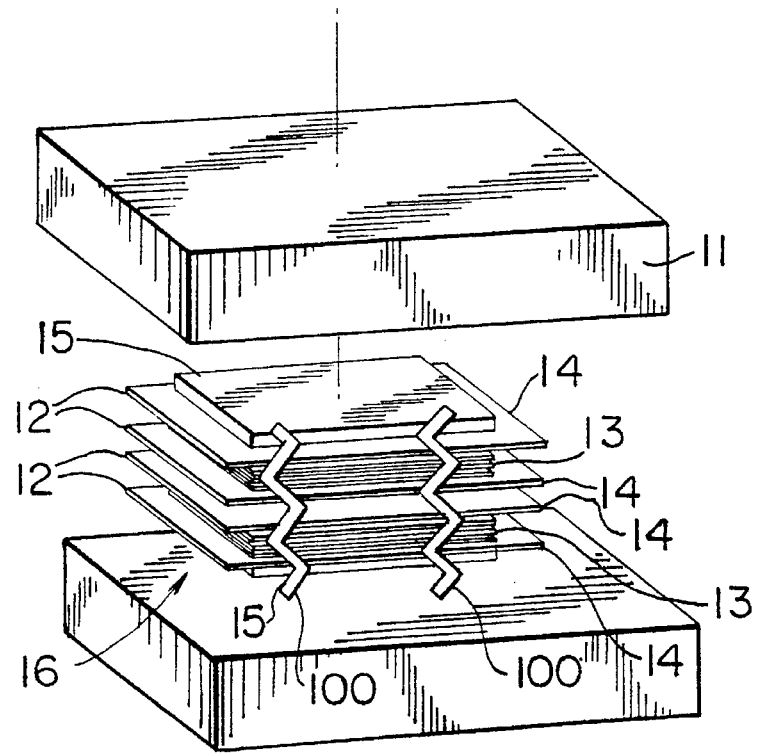
FIG. 7 is a perspective view illustrating heat propagation in the pile of packages in FIG. 1.

FIG. 7 illustrates diagrammatically a prior art press drawn in FIG. 1 and marked 10, the lines marked 100 indicating propagation of heat, emitted by the heating plates 11, or of refrigeration units.

Figure 8:
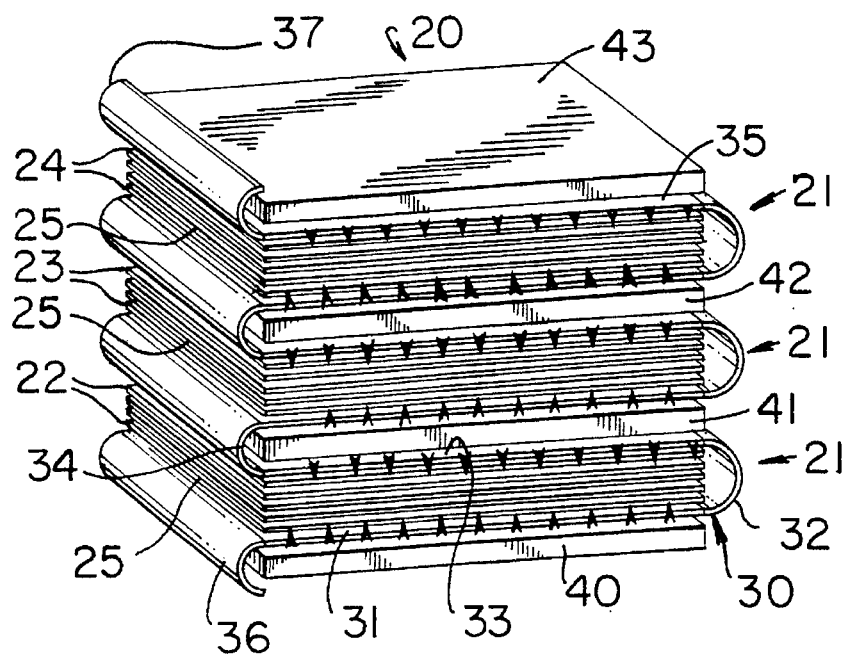
FIG. 8 is a perspective view illustrating heat propagation in the pile of packages in FIG. 2.

FIG. 8 shows the pile of packages seen in FIG. 2, and includes arrows indicating propagation of heat emitted by the various portions 31, 33, 35 of the metal band 30.

I claim:

1. A process for making plastic laminates, each of said plastic laminates having an upper face and a lower face and comprising a plurality of prepreg sheets and a metal lamina on each of said upper and lower faces, said process comprising the steps of:

a) providing a stack comprising a plurality of prepreg sheets, one above the other, a plurality of flattening sheets and a metal band passing in a serpentine manner back and forth through said stack, said metal band having two end portions and extending continuously between said end portions, said stack being arranged such that a substack is formed between adjacent flattening sheets in said stack, each substack including a plurality of prepreg sheets captured between portions of said metal band;

b) connecting the end portions of the metal band to a source of electric current of sufficient power and passing the electric current through the metal band to heat the metal band and thus the prepreg sheets; and c) applying pressure to the stack to bond said prepreg sheets in each substack to its corresponding portions of said metal band, thereby forming each of said substacks into a plastic laminate.

2. A process for making plastic laminates, each of said plastic laminates having an upper face and a lower face and comprising a stack of prepreg sheets with a metal lamina on each of said upper and lower faces, said process comprising the steps of:

a) laying an end portion of a metal band on top of a rigid metal flattening sheet, said metal band having another end portion opposite to said end portion on the flattening sheet and extending continuously between the end portions;

b) placing a group of prepreg sheets on top of said end portion of the metal band on the metal flattening sheet;

c) bending the metal band 180° to form a bend and placing a next portion of the metal band following after the bend on top of the group of prepreg sheets;

d) placing another rigid metal flattening sheet on top of the next portion of the metal band above the group of prepreg sheets;

e) bending the metal band 180° to form a next bend and placing a next portion of the metal band following after the next bend on top of the another rigid metal flattening sheet;

f) repeating, for a number of other groups of prepreg sheets, the steps a) to e) to form a stack of prepreg sheets and flattening sheets with said metal band passing in a serpentine manner back and forth through said stack, each group of prepreg sheets in said stack being captured between corresponding portions of said metal band, which, in turn, are captured between adjacent flattening sheets;

g) connecting the end portions of the metal band to a source of electric current of sufficient power and passing the electric current through the metal band to heat the metal band and thus the prepreg sheets and flattening sheets; and h) applying pressure to the stack to bond each group of prepreg sheets to its corresponding portions of said metal band, thereby forming each of said groups and corresponding portions of said metal band into a plastic laminate.

3. The process as defined in claim 2, further comprising the step of cutting said metal band at said bends to separate the plastic laminates.

4. The process as defined in claim 2, further comprising inserting the stack of prepreg sheets and flattening sheets with the metal band passing back and forth in a serpentine manner therethrough into a cold press and performing the applying of pressure with the cold press.

5. The process as defined in claim 2, further comprising inserting said stack of prepreg sheets and flattening sheets with the metal band passing back and forth in a serpentine manner therethrough into an autoclave and performing the applying of pressure with the autoclave.

6. The process as defined in claim 2, further comprising placing said stack of prepreg sheets and flattening sheets with the metal band passing back and forth in a serpentine manner therethrough into a die, said die comprising an upper plate and a lower plate and pins connecting said upper plate and said lower plate for support and guidance of said upper plate with respect to said lower plate, and performing the applying of pressure with said die.

7. The process as defined in claim 6, further comprising placing said die containing said stack of prepreg sheets and flattening sheets with said metal band passing therethrough into a cold press and performing said applying of pressure with said cold press.

8. The process as defined in claim 6, further comprising placing said die containing said stack of prepreg sheets and said flattening sheets with said metal band passing therethrough into an autoclave and performing said applying of pressure with said autoclave.

9. The process as defined in claim 2, wherein said metal band is made of copper.

10. The process as defined in claim 2, further comprising inserting said stack of prepreg sheets and flattening sheets with the metal band passing back and forth in a serpentine manner therethrough into an autoclave and performing said applying of pressure with said autoclave, wherein said autoclave comprises a bottom portion, a lid, a supporting plate fixed to said bottom portion, another supporting plate connected by an elastic device with an inside surface of said lid, and conducting lamina attached to each supporting plate and connected to said source of said electric current, so that, when said lid is closed after inserting said stack into said autoclave, said conducting laminae are brought into electrical contact with said end portions of said continuous metal band and said electric current passes through said metal band to generate said heat while said pressure is being applied.

* * * * *